(12) United States Patent
Yokoyama (10) Patent No.: US 6,429,599 B1
(45) Date of Patent: Aug. 6, 2002

(54) COLOR ELECTROLUMINESCENCE DISPLAY DEVICE

(75) Inventor: Ryoichi Yokoyama, Ohgaki (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/451,453

(22) Filed: Nov. 30, 1999

(30) Foreign Application Priority Data

Dec. 1, 1998 (JP) ............................ 10-341860
Sep. 30, 1999 (JP) ............................ 11-279875

(51) Int. Cl.$^7$ ................................................ G09G 3/10
(52) U.S. Cl. ..................................... 315/169.3; 313/504
(58) Field of Search ................... 315/169.3; 313/504, 313/505, 506; 438/29; 257/59, 72; 345/36, 45, 76; G09G 3/10

(56) References Cited

U.S. PATENT DOCUMENTS

| | | | |
|---|---|---|---|
| 5,384,517 A | 1/1995 | Uno | 315/169.3 |
| 5,399,936 A | 3/1995 | Namiki et al. | 315/504 |
| 5,550,066 A | 8/1996 | Tang et al. | 437/40 |
| 5,670,792 A * | 9/1997 | Utsugi et al. | 257/59 |
| 5,684,365 A | 11/1997 | Tang et al. | 315/169.3 |
| 5,747,930 A * | 5/1998 | Utsugi | 313/504 |
| 5,838,289 A | 11/1998 | Saito et al. | 345/79 |
| 5,852,481 A | 12/1998 | Hwang | 349/43 |
| 5,897,328 A | 4/1999 | Yamauchi et al. | 438/29 |
| 5,920,080 A | 7/1999 | Jones | 257/40 |
| 5,966,189 A * | 10/1999 | Matsuo | 349/38 |
| 5,990,629 A | 11/1999 | Yamada et al. | 315/169.3 |
| 6,010,796 A | 1/2000 | Kijima | 428/690 |
| 6,133,693 A | 10/2000 | Keyser | 313/506 |
| 6,147,451 A * | 11/2000 | Shibata et al. | 313/506 |
| 6,175,345 B1 * | 1/2001 | Kuribayashi et al. | 345/76 |
| 6,281,634 B1 * | 8/2001 | Yokoyama | 315/169.3 |
| 6,307,322 B1 * | 10/2001 | Dawson et al. | 315/169.3 |

FOREIGN PATENT DOCUMENTS

EP 0717445 A2 6/1996 ............ H01L/27/15

* cited by examiner

Primary Examiner—Don Wong
Assistant Examiner—Trinh Vo Dinh
(74) Attorney, Agent, or Firm—Cantor Colburn LLP (57) ABSTRACT

A first TFT (4), a capacitor (5), a second TFT (6), and an EL element (7) are sequentially arranged in a pixel such that the capacitor (5) functions as a wiring for connecting a source of the first TFT (4) and a gate of the second TFT(6), whereby a dense configuration is formed within the pixel. Further, due to the above-mentioned order of arrangement, space can be provided between pixels of the EL elements (7) in the vertical direction. Therefore, color mixture can be prevented and preferable color purity is obtained even when metal mask positioning is inaccurate.

11 Claims, 7 Drawing Sheets

(PRIOR ART)

COLOR ELECTROLUMINESCENCE DISPLAY DEVICE

BACKGROUND OF THE INVENTION

1. Field of the Invention

The present invention relates to an active type color EL (electroluminescence) display device in which an electroluminescence (EL) element is driven using a thin film transistor(TFT).

2. Description of Related Art

Practical use of organic EL elements in next generation display devices is greatly expected, because such displays can eliminate need for a back light as required in a liquid crystal display device for self-emission, can be optimally made thin, and can have an unlimited viewing angle.

Three methods have commonly been proposed for achieving color display in a display device comprising such an organic EL element.

In the first method, different emissive materials for each of the primary RGB colors are used in corresponding emissive layers to individually form discrete color pixels directly emitting respective RGB light rays. In another method, an emissive layer generates white luminescence which is then converted into three primary colors using color filters. A third method is based on conversion of light from a blue emissive layer into three primary colors using color conversion mediums (CCM). As light energy is lost in the second and third methods above due to the use of color filters or color conversion mediums, the first method is the most effective of these in this respect because a desired light ray is directly emitted.

Meanwhile, to drive an organic EL display device, two types of driving methods, a passive type using a passive matrix and an active type employing TFTS, are available. The circuit configuration shown in FIG. 1 may be used in an active display.

Figure 1:
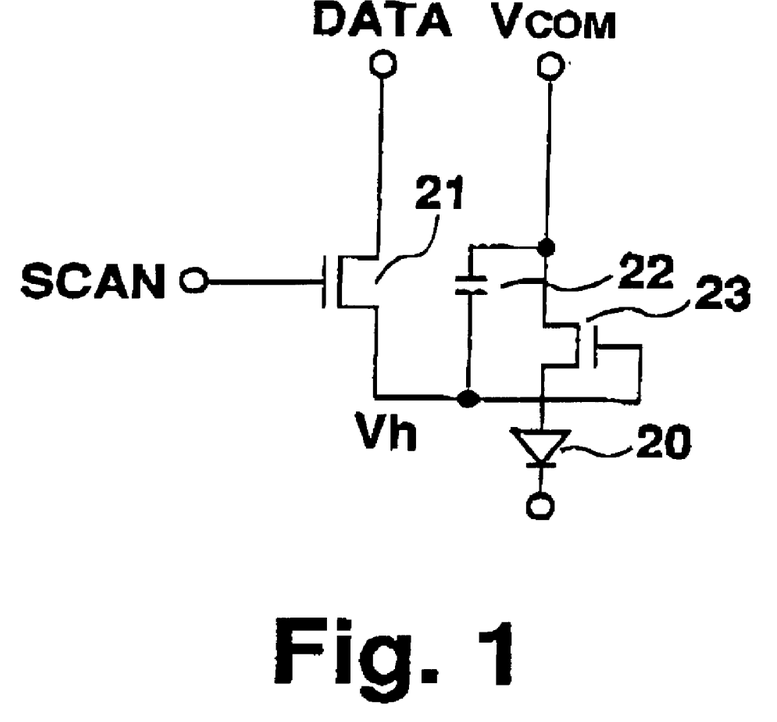
FIG. 1 is a view showing a circuit configuration of an active type color EL display device.

FIG. 1 illustrates a circuit configuration for a single pixel in such a display pixel. Each pixel comprises an organic EL element 20, a first TFT 21 for switching, in which a display signal DATA is applied to a drain and a scan signal SCAN is applied to a gate to switch the TFT on and off, a capacitor 22 which is charged by a display signal DATA applied when the TFT 21 is on and which holds a charge voltage Vh when the TFT 21 is off, a second TFT 23 in which a drain is connected to a drive source of a voltage $V_{COM}$, a source is connected to an anode of the organic EL element 20 and a hold voltage Vh is applied to a gate from the capacitor 22 to drive the organic EL element 20.

A scan signal SCAN rises to an H level during one horizontal scanning period (1H). When the TFT 21 is switched on, a display signal DATA is applied to one end of the capacitor 22, which is then charged by a voltage Vh corresponding to the display signal DATA. This voltage Vh remains held in the capacitor 22 for one vertical scanning period (1V) even after the signal SCAN becomes a low level to switch the TFT 21 off. Because the voltage Vh is supplied to the gate of the TFT 23, the EL element is controlled so as to emit light with a luminance in accordance with the voltage Vh.

The conventional configuration of such an active type EL display device for achieving color display by means of the above-mentioned first method will be now described.

Figure 2:
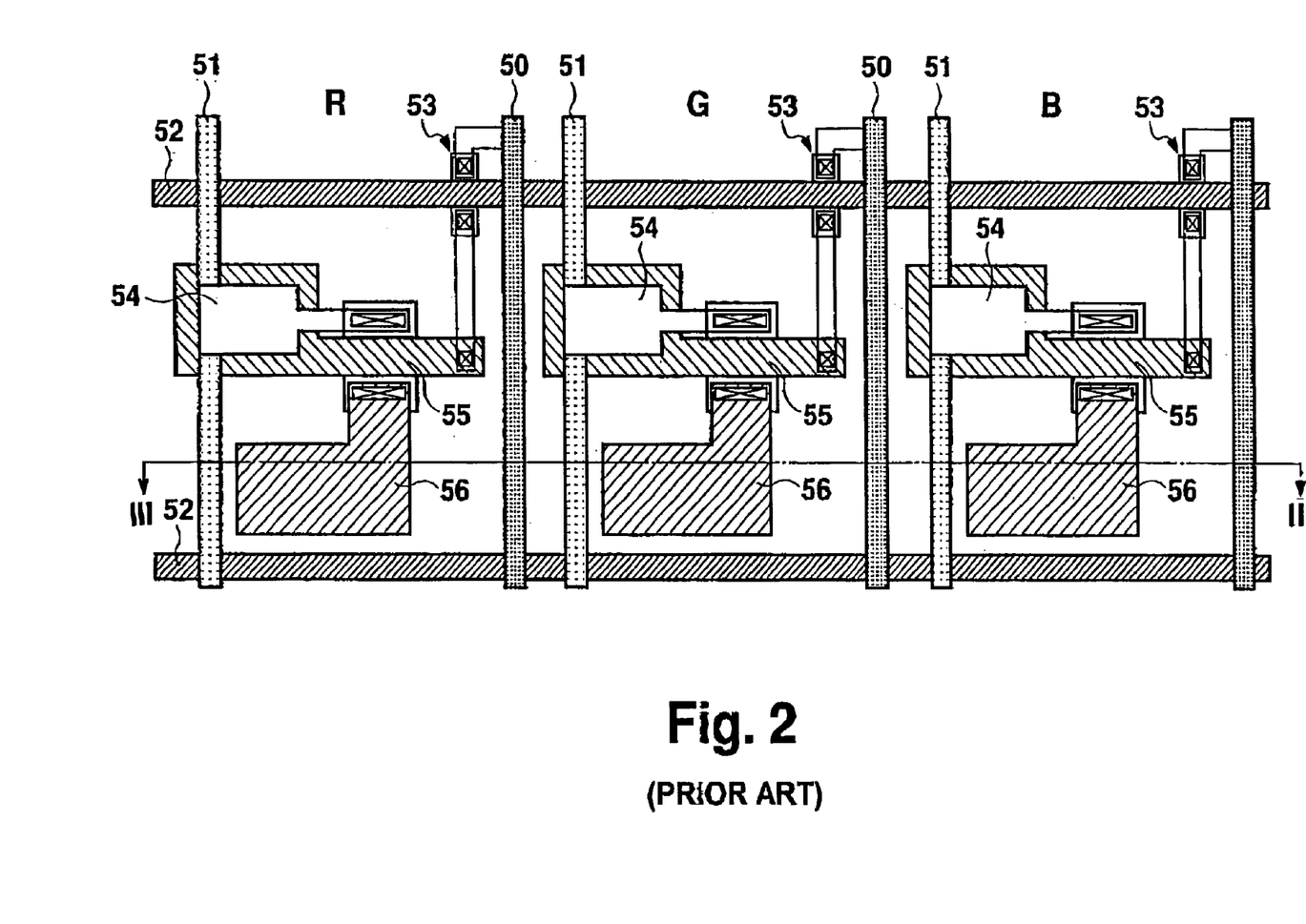
FIG. 2 is a plan view showing a configuration of a conventional color EL display device.
Figure 3:
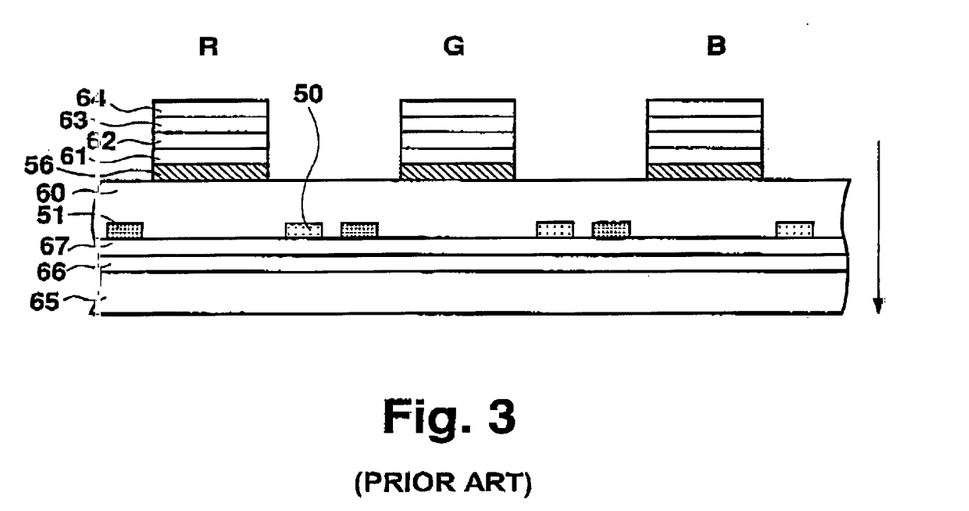
FIG. 3 is cross section showing a configuration of a conventional color EL display device.

FIG. 2 depicts a conceptual plan view showing a configuration of a related art device, and FIG. 3 is a cross section taken along line C—C in FIG. 2. Each of the drawings depicts three pixels.

In FIGS. 2 and 3, numeral 50 represents a drain line for supplying a display signal DATA, numeral 51 represents a drive source line for supplying a supply voltage $V_{COM}$, and numeral 52 represents a gate line for supplying a scan signal SCAN. Further, numerals 53, 54, and 55 designate features corresponding the first TFT 21, the capacitor 22, and the second TFT 23 in FIG. 1, respectively, and numeral 56 designates an anode of the EL element 20 which constitutes a pixel electrode. As shown, discrete anodes 56 are separately formed for each pixel on a planarization insulating film 60. A hole-transport layer 61, an emissive layer 62, an electron-transport layer 63, and a cathode 64 are sequentially laminated on the discrete anode 56, thereby forming an EL element. Holes injected from the anodes 56 and electrons injected from the cathodes 64 are recombined inside the emissive layer 62, which emits light in the direction of the transparent anodes toward outside, as shown by arrows in FIG. 3. Here, discrete hole-transport layers 61, discrete emissive layers 62 and discrete electron-transport layers 63 having substantially the same shape as the discrete anodes 56 are provided for respective pixels. Emissive materials which are different for each RGB are used in the corresponding emissive layers 62, and therefore light rays having respective RGB colors are emitted from respective EL elements. The cathode 64, which applies a common voltage to each pixel, extends over the pixels. Partitions 68 are interposed between adjoining emissive layers 62. Further, numerals 65, 66, and 67 designate a transparent glass substrate, a gate insulating film, and an interlayer insulating film, respectively.

However, the arrangement of the first TFT 53, the capacitor 54, the second TFT 55, and the anode 56 of the related examples do not take sufficient consideration of integration efficiency and therefore a more highly-integrated configuration is in demand.

Figure 4A:
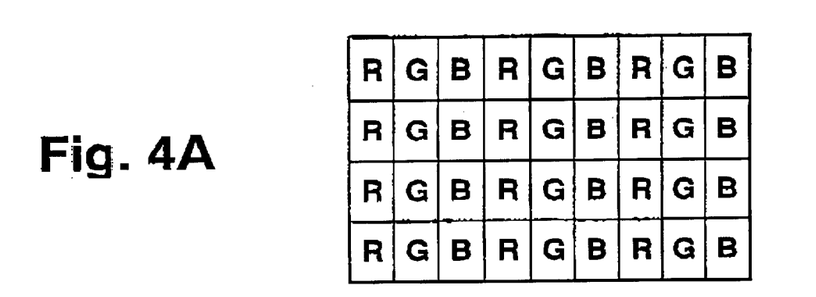
FIGS. 4A, 4B, 4C and 4D are views for explaining color arrangements used in a color EL display device.
Figure 4B:
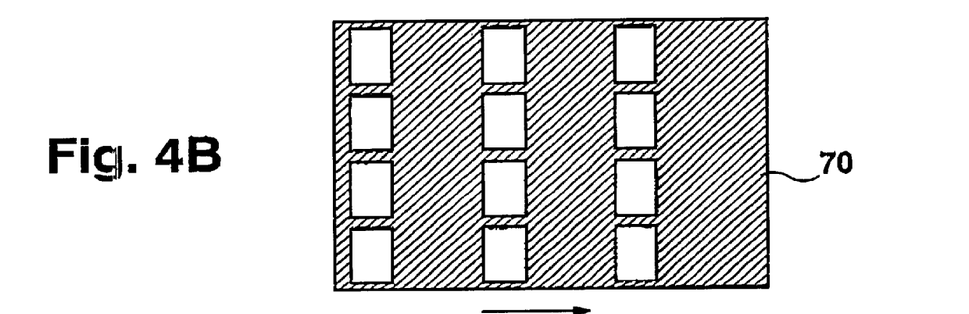
Figure 4C:
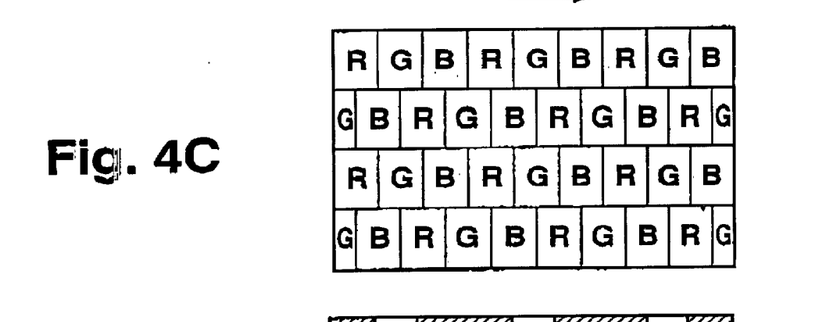

Further, the color display device generally adopts a stripe arrangement as shown in FIG. 4A or a delta arrangement as shown in FIG. 4C as an arrangement for three primary colors of RGB. At the same time, it is necessary to use different luminescent materials for each of RGB such that discrete EL elements can directly emit light rays of respective RGB colors. Therefore, if the stripe arrangement shown in FIG. 4A is adopted, for example, a metal mask 70 shown in FIG. 4B may be used to form the luminescent layers as follows. First, a luminescent layer for R is formed by evaporating only an R color luminescent material onto the hole transport layer. Then, the metal mask 70 is displaced by a distance corresponding to one pixel in the horizontal direction to form a luminescent layer for G by evaporating only a G color luminescent materials on the hole transport layer. Finally, the metal mask 70 is further displaced by one pixel in the horizontal direction to form a luminescent layer for B by evaporating only a B color luminescent material. In the case of the delta arrangement shown in FIG. 4C, the luminescent layers can be similarly formed using the metal mask shown in FIG. 4D.

Figure 4D:
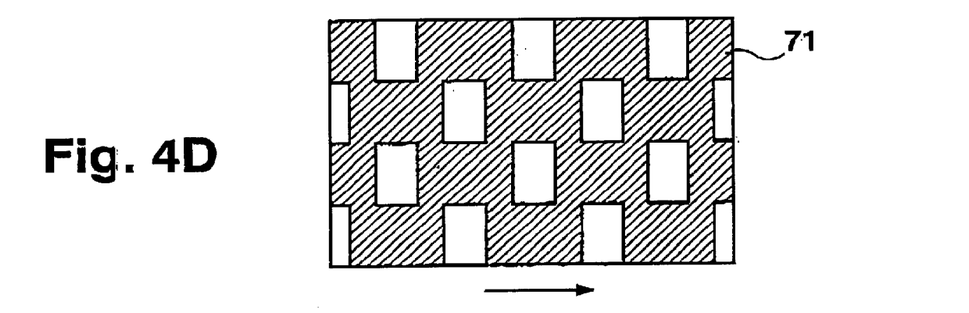

However, during the process for forming the luminescent layers by evaporating the luminescent materials, a so-called "diffusion" phenomenon is caused in which luminescent materials are deposited onto regions other than the regions directly under the openings in the metal masks 70 and 71. Because of such diffusion phenomenon or because of imperfect construction of the metal mask itself, colors in adjoining pixels are adversely mixed causing color purity to deteriorate. Particularly in delta arrangements, wherein adjoining pixels in the column and row directions differ from one another, this disadvantage is further pronounced.

SUMMARY OF THE INVENTION

The present invention provides a color display device suitable for a highly integrated configuration.

In accordance with one aspect of the present invention, a first thin film transistor is disposed in a region between a gate line and a capacitor, and a second thin film transistor is disposed in a region between the capacitor and an EL element. This configuration allows the capacitor, the first thin film transistor, and the second thin film transistors to be densely arranged, thereby facilitating formation of a highly integrated configuration.

In accordance with another aspect of the present invention, said first thin film transistor is connected to one end of one electrode of said capacitor while a gate of said second thin film transistor is connected to the other end which is opposed to said one end of the capacitor. Thus, the first thin film transistor and the gate of the second thin film transistor are electrically connected via the one electrode of the capacitor.

In accordance with still another aspect of the present invention, the capacitor includes a dent region in which the first thin film transistor is disposed. Thus, an efficient arrangement can be achieved.

In accordance with still another aspect of the present invention, the EL element includes a dent region in which the second thin film transistor is disposed. Thus, an efficient arrangement can be achieved.

In accordance with further aspect of the present invention, the capacitor and the EL element are disposed so as to adjoin each other in the column direction, such that space is provided in the vertical direction. Therefore, when forming a pixel electrode (for example, an anode), color mixture among adjoining pixels can be prevented, when metal mask positioning accuracy is low, thereby maintaining preferable color purity for even highly detailed displays.

BRIEF DESCRIPTION OF THE DRAWINGS

These and other objects of the invention will be explained in the description below, in connection with the accompanying drawings, in which.

DESCRIPTION OF THE PREFERRED EMBODIMENTS

Figure 5:
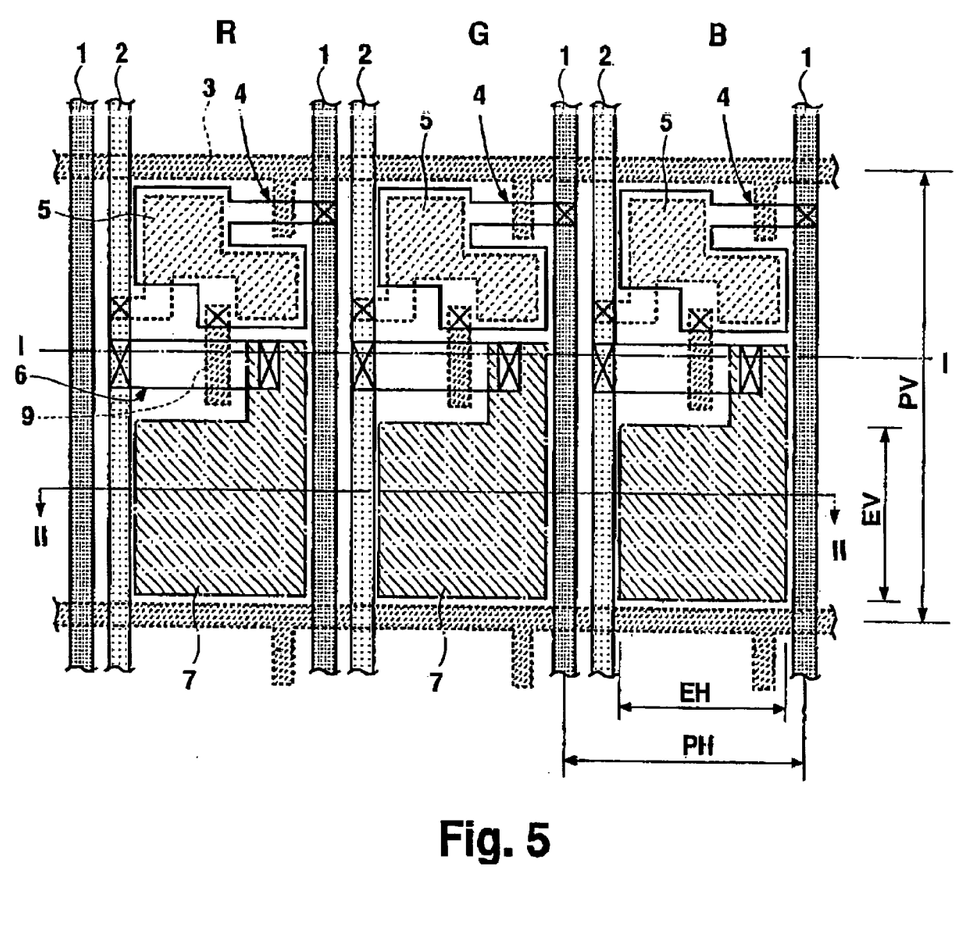
FIG. 5 is a plan view illustrating a first embodiment of the present invention.
Figure 6A:
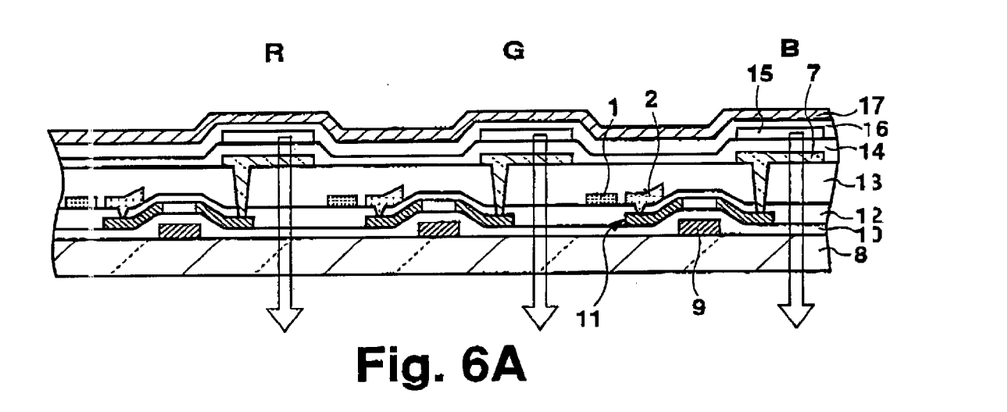
FIGS. 6A and 6B are cross sections illustrating the first embodiment of the present invention.
Figure 6B:
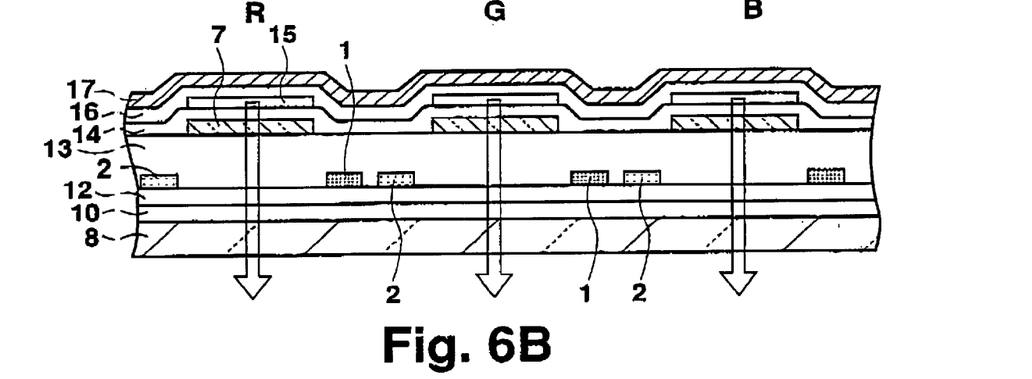

FIG. 5 is a plan view showing a color EL display device in accordance with a first embodiment of the present invention, and depicts the configuration corresponding to three pixels of RGB. Further, FIG. 6A is a cross section taken along a line A—A of FIG. 5, and FIG. 6B is a cross section taken along a line B—B of FIG. 5. This embodiment exemplifies a configuration for the stripe pixel arrangement shown in FIG. 4A.

A driving circuit for each pixel in this embodiment is the same as that in FIG. 1, and the configuration of the device differs from the example shown in FIGS. 2 and 3 in the pattern arrangement and the cross section.

Referring to FIGS. 5, 6A and 6B, the device comprises a data line 1 made of aluminum for supplying a display signal DATA, a power supply line 2 made of aluminum for supplying a power from a drive source COM, and a gate line made of chrome for supplying a scan signal SCAN. Each pixel of the EL display further comprises a first TFT 4 corresponding to the first TFT 21 in FIG. 1, a capacitor 5 corresponding to the capacitor 22 in FIG. 1, a second TFT 6 corresponding to the second TFT 23 in FIG. 1, and an anode (a first electrode) 7 of the EL element 20 comprising ITO and constituting an pixel electrode. In FIG. 5, regions enclosed by dot lines are formed by chromium, regions enclosed by chain lines are formed by ITO, and regions enclosed by solid lines other than the data line 1 and the power supply line 2 are formed using a polysilicon thin film.

The second TFT 6 is formed as follows. First, a gate electrode 9 is formed on a transparent glass substrate 8, and a gate insulating film 10 is formed thereupon. Then, a polysilicon thin film 11 formed on the gate insulating film 10 is covered with an interlayer insulating film 12, on which the data line 1 and the power supply line 2 are formed. A planarization insulating film 13 is further formed thereon and the anode 7 comprising ITO is finally formed on the planarization insulating film 13. Then, the drain region of the polysilicon thin film 11 is brought into contact with the power supply line 2 while the source region of the polysilicon thin film 11 is brought into contact with the anode 7.

The configuration of the first TFT 4 is substantially the same as that of the second TFT 6, with the notable exception that the drain region of the first TFT 4 is connected to the data line 1, and not to the power supply line 2. Further, the capacitor 5 connected to the first TFT 4 comprises a chromium electrode and a polysilicon thin film having a gate insulating film interposed therebetween.

The discrete anodes 7 are formed on the planarization insulating film 13 corresponding to respective pixels, and a hole-transport layer 14 is formed thereon so as to cover the entire pixels. Then, discrete emissive layers 15 are formed for each pixel, on which an electron-transport layer 16 and a cathode 17 are laminated in this order to complete formation of an EL element. Holes injected from the anode 7 and electrons injected from the cathode 17 are recombined inside the emissive layer 15, which emits light in the direction of the transparent anode toward outside, as indicated by arrows in FIGS. 6A and 6B. The discrete emissive layers 15 are formed for respective pixels to have substantially the same shape as the discrete anodes 7, and different emissive materials are used for each of the RGB colors. Thus, each EL element emits one type of RGB light.

Materials of, for example, MTDATA, $Alq_3$, and MgIn alloy may be used for the hole-transport layer 14, the electron-transport layer 16, and the cathode 17, respectively. Further, for example, Alq containing DCM type as dopant is used for the emissive layer 15 for R, Alq containing quinacridon as dopant is used for the emissive layer 15 for G, and DPVBi containing distyrylarylene or Perylene as dopant is used in the emissive layer 15 for B.

In this embodiment, as shown in FIG. 5, the first TFT 4 is disposed in a region between the gate line 3 and the capacitor 5, and the capacitor 5 includes a dent region in which the first TFT 4 is disposed. The dent region is formed by removing a corner portion of a rectangular shape (capacitor 5). In addition, the opposite corner portion of the rectangular shape (capacitor 5) is also removed. Further, the second TFT 6 is disposed in a region between the capacitor 5 and the anode 7, and the anode includes a dent region in which the second TFT 6 is disposed. The dent region is formed by removing a corner portion of a rectangular shape (anode 7). The capacitor 5 also functions as a wiring for connecting the source of the first TFT 4 and the gate electrode of the second TFT 6. Due to such configuration, it is possible to densely arrange the first TFT 4, the capacitor 5, the second TFT 6, and the anode 7, thereby increasing the integration efficiency of pixels to achieve highly detailed display.

Figure 7:
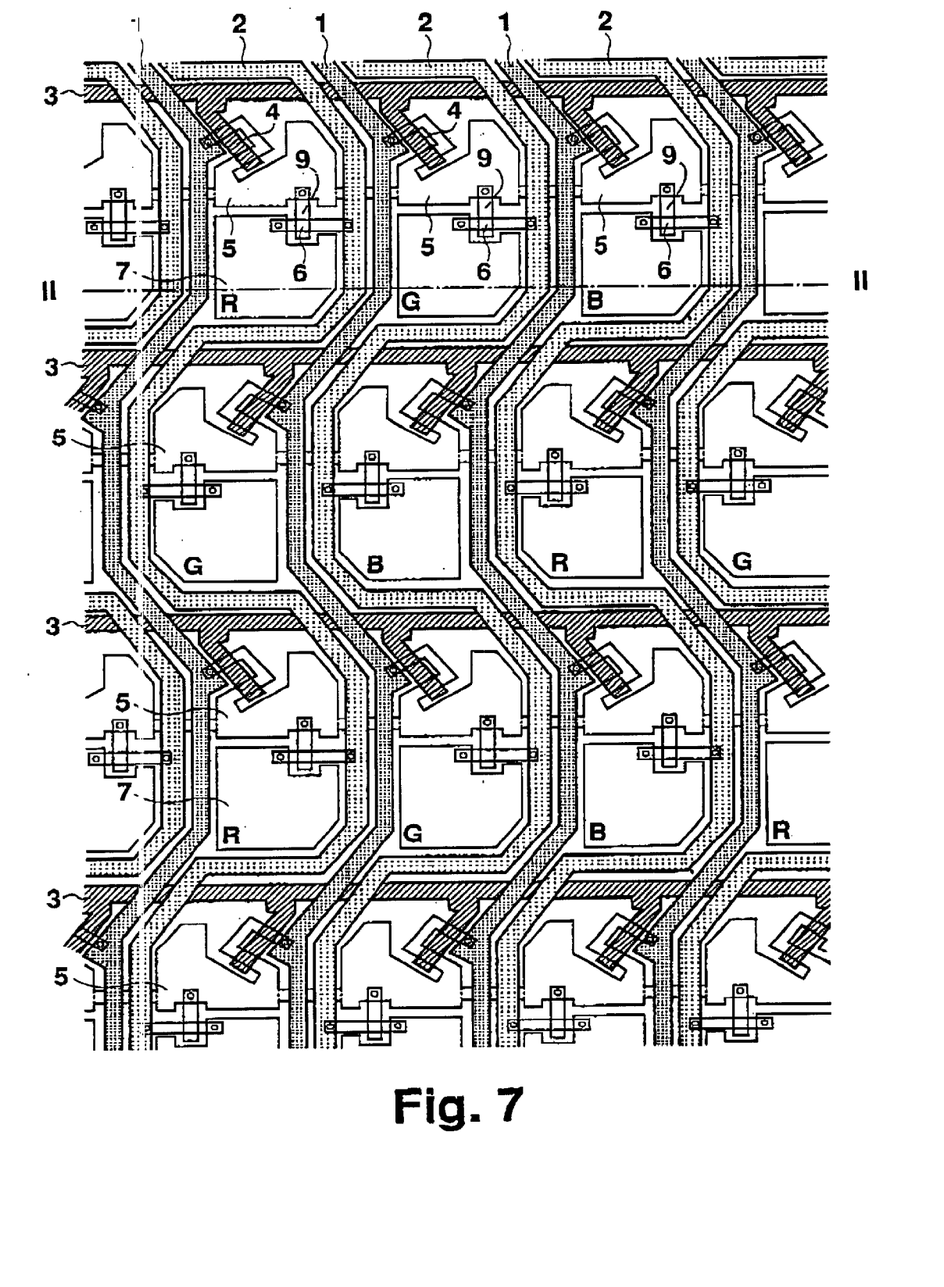
FIG. 7 is a plan view illustrating a second embodiment of the present invention.

FIG. 7 depicts, in plan view, the second embodiment of the present invention. In FIG. 7, the same elements as shown in FIGS. 1, 5 and 6 are designated by the same reference numerals, and the detailed description thereof will be omitted. In FIG. 7, numeral 4 denotes a first TFT corresponding to the first TFT 21 of FIG. 1, numeral 5 denotes a capacitor corresponding to the capacitor 22 of FIG. 1, numeral 6 denotes a second TFT corresponding to the second TFT 23 of FIG. 1 and numeral 7 denotes an anode of the EL element 20 comprising ITO and constituting a pixel electrode. This embodiment exemplifies a configuration in the case of a delta pixel arrangement as shown in FIG. 4C.

In this embodiment, as in the first embodiment, the first TFT 4 is disposed in a region between the gate line 3 and the capacitor 5, and the capacitor 5 includes a dent region in which the first TFT 4 is disposed. Further, the second TFT 6 is disposed in a region between the capacitor 5 and the anode 7, and the anode 7 includes a dent region in which the second TFT 6 is disposed. The capacitor 5 also functions as a wiring for connecting the first TFT 4 and the second TFT 6. Due to such configuration, it is possible to densely arrange the first TFT 4, the capacitor 5, the second TFT 6, and the anode 7, thereby increasing the integration efficiency of pixels and achieving a highly detailed display.

When a delta arrangement is used, pixels of different colors adjoin with one another in the column direction, as shown in FIG. 4C. In this embodiment, however, because the first TFT 4 and the capacitor 5 are disposed in the vertical direction of the anode 7 which is a pixel electrode, gaps between the EL elements in the column direction can be sufficiently secured. As described above, by forming the pixel electrode 7 and the luminescent layer 15 with substantially the same shape, the luminescent region of a pixel and the pixel electrode itself also have substantially the same shape. When this is the case, if the dimensions of the luminescent region in the horizontal and vertical directions are EH and EV, respectively, and that the dimensions of the pixel pitch in the horizontal and vertical directions are PH and PV, respectively, the relationship $EH/EV \geq PH/PV$ will hold. Because of this configuration, capacity against diffusion of the luminescent materials is increased in the vertical direction when forming the respective RGB luminescent layers using the metal mask, thereby reducing a possibility of color mixture even if the luminescent layers are formed with a manufacturing accuracy which is similar in the prior art.

In a typical delta arrangement, pixels of the same color which are adjacent in the column direction are displaced from each other in the row direction by a distance corresponding to about 1.5 pixels. Therefore, the arrangement including such an 1.5 pixel displacement is preferably used in the present invention. However, the size of pixel displacement is not limited to 1.5 and the arrangement including an 1.2 pixel displacement as shown in FIG. 7 may be used.

According to the present invention, since the first thin film transistor is disposed between the gate line and the capacitor and the second thin film transistor is disposed between the capacitor and the EL element, it is possible to densely arrange these features so as to achieve a highly integrated configuration.

Further, color mixture in adjoining pixels which causes deterioration of color purity can be prevented in an active type color EL display device, thereby maintaining preferable color purity even in a highly detailed display.

Specifically, by disposing at least part of a capacitor or a thin film transistor in the horizontal direction of the luminescent region of each pixel, a room is provided in each pixel in the horizontal direction such that highly detailed display can be achieved even if accuracy in metal mask positioning is low.

Although the present invention is also applicable to a delta pixel arrangement, the above-mentioned effects especially work in a stripe arrangement.

What is claimed is:

1. An electroluminescence display device in which a plurality of pixels are arranged in row and column directions, comprising:
    a gate line extending in the row direction;
    a first thin film transistor whose gate is connected to said gate line;
    a drain line extending in the column direction;
    capacitor connected to said drain line via said first thin film transistor;
    second thin film transistor whose control electrode is connected to said capacitor; and
    an EL element connected to a supply line via said second thin film transistor and having a luminescent layer between an anode and a cathode,
        wherein said first thin film transistor is disposed in a region between said gate line and said capacitor, and said second thin film transistor is disposed in a region between said capacitor and said EL element.

2. An electroluminescence display device according to claim 1,
    wherein said first thin film transistor is connected to one end of an electrode of said capacitor, and a gate of said second thin film transistor is connected to another end of said electrode of said capacitor.

3. An electroluminescence display device according to claim 1,
    wherein said capacitor and said EL element are disposed so as to be adjacent to each other in the column direction.

4. An electroluminescence display device according to claim 1,
    wherein luminescent materials which are different for each of RGB colors are used for said luminescent layer, such that each EL element emits either one of RGB colors.

5. An electroluminescence display device according to claim 1,
    wherein said plurality of pixels are arranged in a matrix so as to form a delta arrangement in which adjacent pixels in the column direction are displaced from one another.

6. An electroluminescence display device in which a plurality of pixels are arranged in row and column directions, comprising:

a gate line extending in the row direction;

a first thin film transistor whose gate is connected to said gate line;

a drain line extending in the column direction;

a capacitor connected to said drain line via said first thin film transistor;

a second thin film transistor whose control electrode is connected to said capacitor; and an EL element connected to a supply line via said second thin film transistor and having a luminescent layer between an anode and a cathode, wherein said first thin film transistor is disposed in a region between said gate line and said capacitor, and said second thin film transistor is disposed in a region between said capacitor and said EL element, wherein said first thin film transistor is connected to one end of an electrode of said capacitor, and a gate of said second thin film transistor is connected to another end of said electrode of said capacitor, and wherein said capacitor includes a dent region which is opposed to both the gate and the drain line, and the first thin film transistor is disposed in said dent region.

7. An electroluminescence display device according to claim 6, wherein luminescent materials which are different for each of RGB colors are used for said luminescent layer, such that each EL element emits either one of RGB colors.

8. An electroluminescence display device according to claim 6, wherein said plurality of pixels are arranged in a matrix so as to form a delta arrangement in which adjacent pixels in the column direction are displaced from one another.

9. An electroluminescence display device in which a plurality of pixels are arranged in row and column directions, comprising:

a gate line extending in the row direction;

a first thin film transistor whose gate is connected to said gate line;

a drain line extending in the column direction;

a capacitor connected to said drain line via said first thin film transistor;

a second thin film transistor whose control electrode is connected to said capacitor; and an EL element connected to a supply line via said second thin film transistor and having a luminescent layer between an anode and a cathode, wherein said first thin film transistor is disposed in a region between said gate line and said capacitor, and said second thin film transistor is disposed in a region between said capacitor and said EL element, wherein said first thin film transistor is connected to one end of an electrode of said capacitor, and a gate of said second thin film transistor is connected to another end of said electrode of said capacitor, and wherein said EL element includes a dent region which is adjacent and opposed to the capacitor and the supply line, and the second thin film transistor is disposed in said dent region.

10. An electroluminescence display device according to claim 9, wherein luminescent materials which are different for each of RGB colors are used for said luminescent layer, such that each EL element emits either one of RGB colors.

11. An electroluminescence display device according to claim 9, wherein said plurality of pixels are arranged in a matrix so as to form a delta arrangement in which adjacent pixels in the column direction are displaced from one another.

* * * * *

UNITED STATES PATENT AND TRADEMARK OFFICE
CERTIFICATE OF CORRECTION

PATENT NO. : 6,429,599 B1
DATED : August 6, 2002
INVENTOR(S) : Ryoichi Yokoyama

It is certified that error appears in the above-identified patent and that said Letters Patent is hereby corrected as shown below:

Title page,
Item [75], Inventor, after "Yokoyama," delete "Ohgaki" and insert -- Gifu --;

Drawings,
FIG 1, insert -- PRIOR ART --;

Column 1,
Line 66, after "line" delete "C-C" and insert -- III - III --;

Column 3,
Line 66, after "line" delete "A-A" and insert -- I - I --; and
Line 67, after "line" delete "B-B" and insert -- II - II --;

Column 6,
Line 31, before "capacitor" insert -- a --; and
Line 33, before "second" insert -- a --.

Signed and Sealed this

Seventeenth Day of January, 2006

JON W. DUDAS
*Director of the United States Patent and Trademark Office*